US009836569B2

(12) United States Patent
Sukharev et al.

(10) Patent No.: US 9,836,569 B2
(45) Date of Patent: Dec. 5, 2017

(54) LEAKAGE REDUCTION USING STRESS-ENHANCING FILLER CELLS

(71) Applicant: Mentor Graphics Corporation, Wilsonville, OR (US)

(72) Inventors: Valeriy Sukharev, Campbell, CA (US); Junho Choy, Sunnyvale, CA (US); Armen Kteyan, Yerevan (AM); Henrik Hovsepyan, Yerevan (AM)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 15/085,044

(22) Filed: Mar. 30, 2016

(65) Prior Publication Data

US 2016/0292341 A1 Oct. 6, 2016

Related U.S. Application Data

(60) Provisional application No. 62/140,370, filed on Mar. 30, 2015.

(51) Int. Cl.
*G06F 9/455* (2006.01)
*G06F 17/50* (2006.01)
*H01L 27/02* (2006.01)

(52) U.S. Cl.
CPC ...... *G06F 17/5072* (2013.01); *G06F 17/5081* (2013.01); *H01L 27/0207* (2013.01)

(58) Field of Classification Search
USPC ........................................................ 716/133
See application file for complete search history.

(56) References Cited

U.S. PATENT DOCUMENTS

2011/0258588 A1\* 10/2011 Sharma ............... G06F 17/5072
716/108

OTHER PUBLICATIONS

Kahng, Andrew B.; Sharma, Puneet; Topaloglu, Rasit Onur; "Chip Optimization Through STI-Stress-Aware Placement Perturbations and Fill Insertion," Jul. 2008, IEEE.\*
Sukharev, et al. "3D IC TSV based technology: stress assessment for chip performance" AIP conference proceedings 1300: (2010) p. 202.
Sukharev, et al. "Multi-scale Simulation Methodology for Stress Assessment in 3D IC: Effect of Die Stacking on Device Performance" J. Electron Test, vol. 28 (2012), p. 63.
A. B. Kahng, P. Sharma and R. O. Topalogu, "Chip Optimization Through STI-Stress-Aware Placement Perturbations and Fill Insertion" IEEE Transactions on Computer-Aided Design of Integrated Circuits and Systems, vol. 27 (2008), p. 1241.

(Continued)

*Primary Examiner* — Eric Lee
(74) *Attorney, Agent, or Firm* — Klarquist Sparkman, LLP (57) ABSTRACT

Aspects of the disclosed technology relate to techniques of inserting stress-enhancing filler cells for leakage reduction. Stress analysis is first performed to identify devices with large leakage current in a layout design. An optimization zone in a row of cells that contains one or more of the devices with large leakage current is then determined. Stress-enhancing filler cells are inserted into the optimization zone to replace some or all of the one or more filler cells while placement of the cells in the optimization zone is adjusted based on a leakage reduction analysis.

17 Claims, 8 Drawing Sheets

Flow chart
500

(56) References Cited

OTHER PUBLICATIONS

C.-Y. Cheng, Y.-K. Fang et al. "New observations in LOD effect of 45-nm p-MOSFET with strained SiGe source/drain and dummy gate", . IEEE Transactions on Electron Devices, vol. 56 (2009), p. 1618.
M. Miyamoto, H. Ohta, Y. Kumagai, Y. Sonobe, K. Ishibashi, Y. Tainaka "Impact of Reducing STI-induced Stress on Layout Dependence of MOSFET Characteristics" IEEE Trans. Electron Dev. vol. 51 (2004) p. 440.
V. Joshi, B. Cline, D. Sylvester, D. Blaauw, K. Agarwal "Leakage Power Reduction Using Stress-Enhanced Layouts" Proceedings of Design Automation Conference (2008) p. 912.
F. Fallah, and M. Pedram, "Standby and active leakage current control and minimization in CMOS VLSI circuits, IEICE Trans. Electron. (Special Section on Low-Power LSI and Low-Power IP)", vol. E88-C (2005) p. 509.
K. Roy, S. Mukhopadhyay, and H. Mahmoodi-Meimand "Leakage Current Mechanisms and Leakage Reduction Techniques in Deep-Submicrometer CMOS Circuits" Proceedings of the IEEE, vol. 91 (2003) p. 305.
S. Kumar Singh, B. K. Kaushik, D. S. Chauhan and S. Kumar "Reduction of Subthreshold Leakage Current in MOS Transistors" World Applied Sciences Journal vol. 25 (2013) p. 446.

\* cited by examiner

LEAKAGE REDUCTION USING STRESS-ENHANCING FILLER CELLS

RELATED APPLICATIONS

This application claims the benefit of U.S. Provisional Patent Application No. 62/140,370, filed on Mar. 30, 2015, entitled "Leakage Redaction Using Stress-Enhancing Filler Cells" and naming Valeriy Sukharev et al. as inventors, which application is incorporated entirely herein by reference.

FIELD OF THE DISCLOSED TECHNOLOGY

The present disclosed technology relates to circuit design and fabrication. Various implementations of the disclosed technology may be particularly useful for reducing leakage current of devices in a circuit design.

BACKGROUND OF THE DISCLOSED TECHNOLOGY

As downward scaling of transistors continues, optimizing power consumption for mobile devices is a major concern. Power consumption consists of two components: dynamic and static. Dynamic (active) power is used while the chip is performing various functions, while static (leakage) power is consumed by leakage current. For both high-performance and low-cost mobile devices developed with deep sub-micron technology, static power has become the major source of total power consumption, primarily due to the transistor's off-state sub-threshold leakage current ($I_{sub}$). The downward scaling of transistors reduces the transistor's threshold voltage ($V_t$), which in turn causes an increase in the sub-threshold leakage current (because $I_{sub}$ is an exponential function of $V_t$). Designers are facing an increased challenge in meeting strict $I_{sub}$ targets.

There are two major leakage reduction techniques currently in use: circuit-based and process-based. The circuit-based technique uses transistor stacking, or multi-threshold voltages. One popular method is a dual-threshold CMOS (complementary metal-oxide semiconductor) that uses high-threshold voltage transistors on non-critical paths to reduce leakage power, and low-threshold transistors on critical paths to maintain circuit performance. Although this technique can be quite effective in reducing sub-threshold leakage current, it adds significant complexity to the process because it requires additional mask steps.

The process-based technique controls the physical dimensions of device components, such as diffusion length or oxide thickness, or introduces mechanical stress in the device's channel and source/drain regions during device fabrication. The presently disclosed technology uses stress-enhancing filler cells to introduce stress in the device's channel region, which can affect the diffusion of pocket ion implants, consequently changing the $V_t$.

BRIEF SUMMARY OF THE DISCLOSED TECHNOLOGY

Aspects of the disclosed technology relate to techniques of inserting stress-enhancing filler cells for leakage reduction. In one aspect, there is a method comprising: determining an optimization zone in a row of cells on a layout design, the optimization zone being a portion of the row of cells between two consecutive fixed cells, the optimization zone comprising unfixed cells and one or more filler cells, the fixed cells being functional cells of which positions cannot be changed, and the unfixed cells being functional cells of which positions can be changed; and inserting stress-enhancing filler cells into the optimization zone to replace some or all of the one or more filler cells while cell placement of the optimization zone is adjusted based on a leakage reduction analysis.

The method may further comprise: performing stress analysis to identify devices with large leakage current, wherein one or more of the devices with large leakage current are in the optimization zone.

The optimization zone may comprise one or more unfixed cells having devices with large leakage current. The devices with large leakage current may be identified based on analyzing layout-induced stress of devices of the layout design. The identified devices with large leakage current may be pMOS (p-type metal-oxide-semiconductor) devices. The stress-enhancing filler cells may be obtained by removing active area from n-well regions of the filler cells.

Devices of the layout design may be placed and routed before the inserting, wherein the routing of the unfixed cells is removed and the inserting keeps the order of the unfixed cells, and wherein the method further comprises: performing rerouting.

The inserting comprises placing the stress-enhancing filler cells first next to an unfixed cell that can lead to the largest reduction in leakage current, then next to an unfixed cell that can lead to the second largest reduction in leakage current and so on.

In another aspect, there are one or more non-transitory computer-readable media storing computer-executable instructions for causing one or more processors to perform the above method.

In still another method, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

Various aspects of the present disclosed technology relate to techniques of using stress-enhancing filler cells to reduce leakage. In the following description, numerous details are set forth for purpose of explanation. However, one of ordinary skill in the art will realize that the disclosed technology may be practiced without the use of these specific details. In other instances, well-known features have not been described in detail to avoid obscuring the present disclosed technology.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "insert" and "determine" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device.

Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

Figure 1:
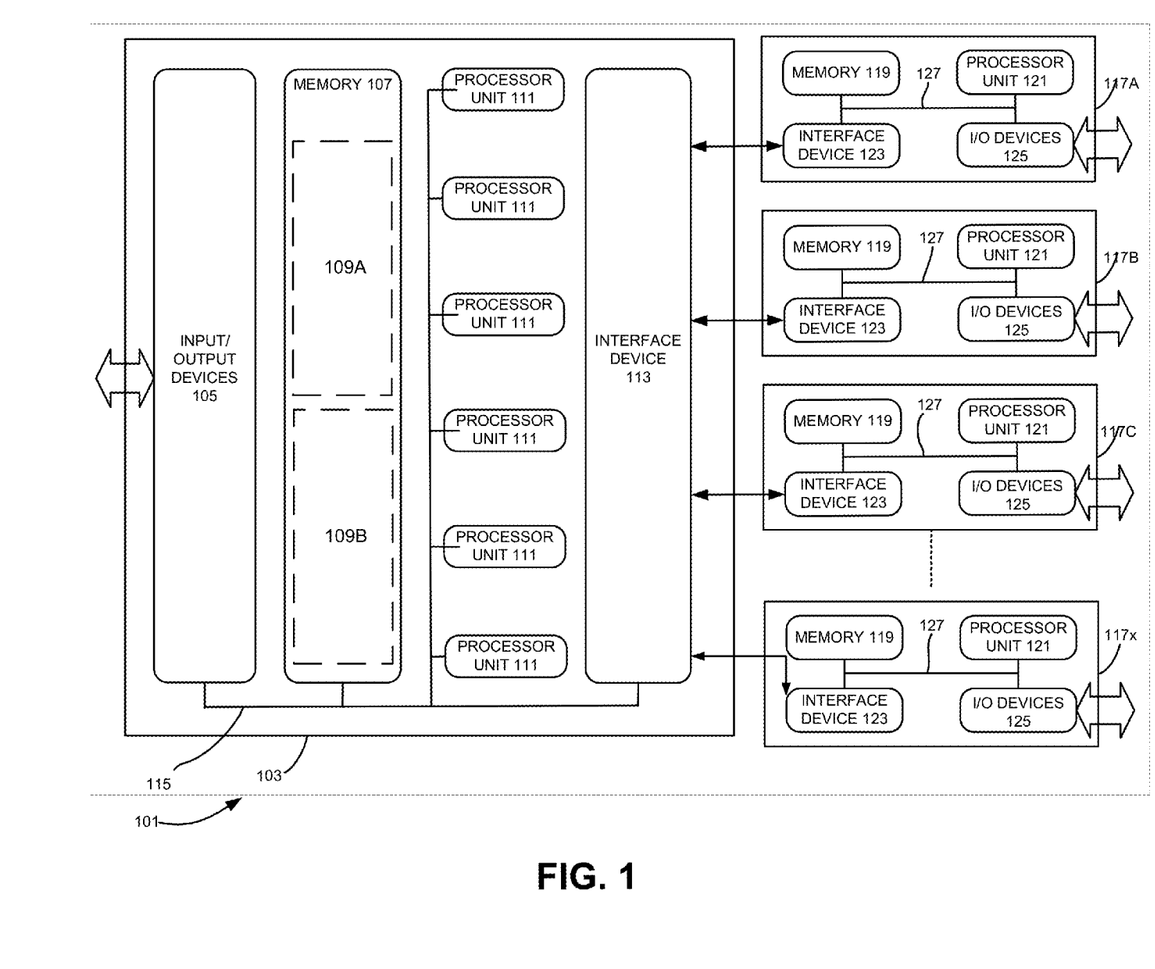
FIG. 1 illustrates an example of a computing system that may be used to implement various embodiments of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
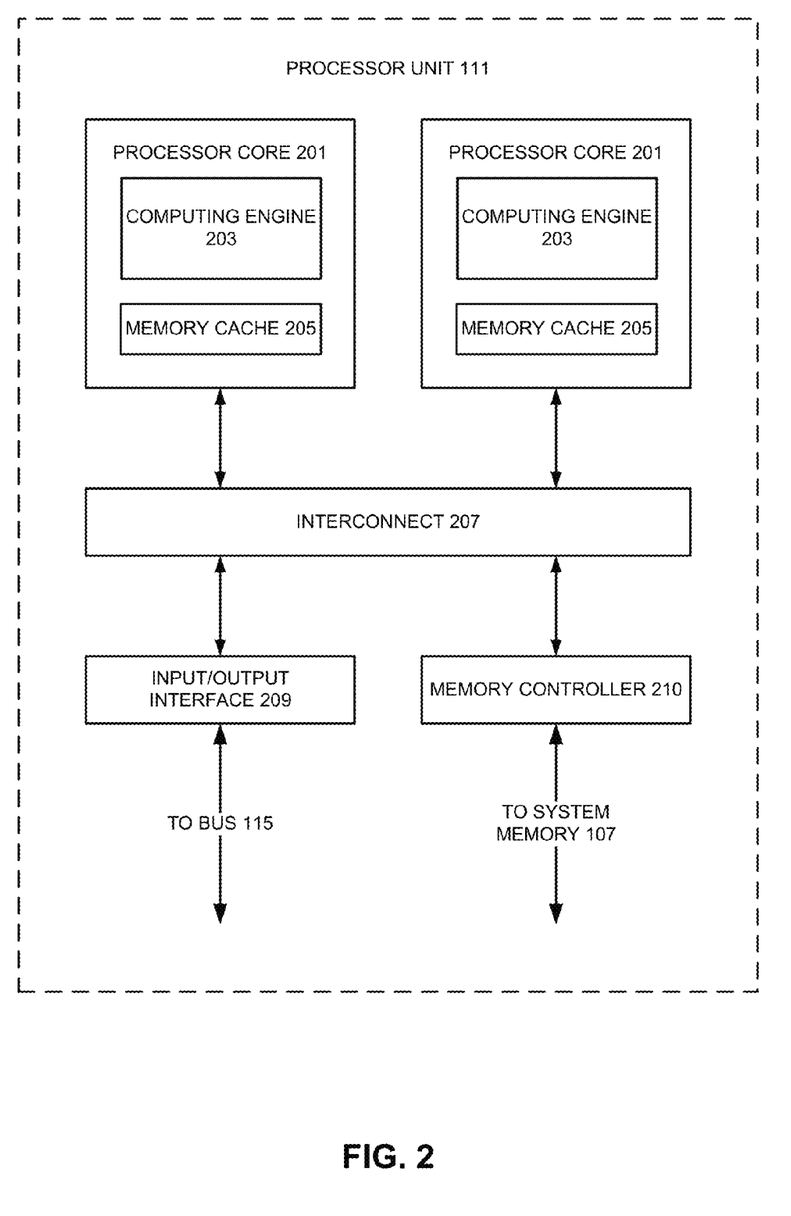
FIG. 2 illustrates an example of a multi-core processor unit that may be used to implement various embodiments of the disclosed technology.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Circuit Design and Fabrication

Electronic circuits, such as integrated circuits (ICs), are used in a variety of products, from automobiles to microwaves to personal computers. Designing and fabricating IC devices typically involves many steps, sometimes referred to as the "design flow." The particular steps of a design flow often are dependent upon the type of the circuit, its complexity, the design team, and the circuit fabricator or foundry that will manufacture the circuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, such as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing IC components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

Circuit layout descriptions can be provided in many different formats. The Graphic Data System II (GDSII) format is a popular format for transferring and archiving two-dimensional (2D) graphical circuit layout data. Among other features, it contains a hierarchy of structures, each structure containing layout elements (e.g., polygons, paths or poly-lines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in design layouts that are employed to manufacture integrated circuits. Once the design is finalized, the layout portion of the design can be used by fabrication tools to manufacture the circuit using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in a design layout define the relative locations or areas of the circuit that will be exposed to radiation through the mask. A mask or reticle writing tool is used to create the mask based upon the design layout, after which the mask can be used in a photolithographic process.

The design of a new integrated circuit may include the interconnection of millions of transistors, resistors, capacitors, or other electrical structures into logic circuits, memory circuits, programmable field arrays, and other circuit devices. In order to allow a computer to more easily create and analyze these large data structures (and to allow human users to better understand these data structures), they are often hierarchically organized into smaller data structures, typically referred to as "cells." Thus, for a microprocessor or flash memory design, all of the transistors making up a memory circuit for storing a single bit may be categorized into a single "bit memory" cell. Rather than having to enumerate each transistor individually, the group of transistors making up a single-bit memory circuit can thus collectively be referred to and manipulated as a single unit. Similarly, the design data describing a larger 16-bit memory register circuit can be categorized into a single cell. This higher level "register cell" might then include sixteen bit memory cells, together with the design data describing other miscellaneous circuitry, such as an input/output circuit for transferring data into and out of each of the bit memory cells. Similarly, the design data describing a 128 kB memory array can then be concisely described as a combination of only 64,000 register cells, together with the design data describing its own miscellaneous circuitry, such as an input/output circuit for transferring data into and out of each of the register cells.

In designing application-specific integrated circuits (ASICs) with mostly digital-logic features, a standard cell library is usually used. The standard cell library consists of pre-defined digital building blocks—standard cells. A standard cell is a group of transistor and interconnect structures that provides a boolean logic function (e.g., AND, OR, XOR, XNOR, inverters) or a storage function (flip-flop or latch). These standard cells have optimized layouts and are fully characterized for performance. They typically are of a fixed height, enabling them to be placed in rows and thus easing the process of automated digital layout. Standard cell libraries provide identical functional cells between process nodes, or between different process technologies, making cell-based circuits more scalable and portable.

Process-Based Leakage Reduction

New capabilities in design verification tools enable designers to perform stress assessment in stacked 3D-IC chips, as well as analyze the layout-induced transistor-to-transistor stress variation generated by various strain-engineered sources. These sources include contact etch stop layers (CESL), a variety of stress memorization techniques (SMT), and shallow trench isolation (STI) regions. The physics-based compact model employed enables designers to account for both mobility and $V_t$ modifications caused by stress sources. Using such layout stress analysis functionality, a post-placement simulation algorithm and flow to reduce the off-state leakage current of MOSFET devices may be developed.

As device scaling continues, $I_{sub}$ has become much larger than other leakage components in off-state. This is mainly because $V_t$ is relatively low in modern CMOS devices. As stated earlier, $I_{sub}$ is an exponential function of $V_t$, which depends on the level of the intra channel mechanical stress. The threshold voltage shift at zero-bias caused by stress can be described as follows:

$$\Delta V_t = C_1 \sigma_{Hyd} + C_2 \frac{1 - \exp\{C_3 \sigma_{Hyd}^{STI}\}}{L_{gate}} \quad (1)$$

Here, the first term describes the effect of total hydrostatic stress ($\sigma o_{Hyd} = \sigma_x + \sigma_x + \sigma_x)/3$), due to change of Si band gap. The second term corresponds to $V_t$ change caused by stress-induced variation of dopants profiles. Since the doping profiles are formed before the strain engineering related steps, only STI-induced unintentional stress can impact on dopants distribution: the corresponding hydrostatic stress ($\sigma_{Hyd}^{STI}$) is able to change the dopants diffusivity, causing variations of their concentration at the channel edges. The resulting change of the effective gate length is responsible for $\Delta V_t$. In Eq.(1), $C_1$, $C_2$, $C_3$ are the process-dependent parameters, and $L_{gate}$ is the gate channel length.

Mechanical stress not only may change $V_t$ based on affecting diffusion of pocket ion implants in channel region during the device fabrication process but also may affect carrier mobility. The latter effect is not desirable as it deteriorates the device performance. For moderate strain values, the piezoresistance model is valid for the stress-induced effect on charge carrier mobility in silicon, which implies a linear dependency on stress components:

$$\frac{\Delta U}{U0} = -(\pi_x \sigma_x + \pi_y \sigma_y + \pi_z \sigma_z) \quad (2)$$

Here, $\Delta U$ is a stress-induced modification of the charge carrier mobility, U0 is defined as the "low field mobility" in BSIM MOSFET model (http://www-device-.eecs.berkeley.edu/bsim/Files/BSIM4/BSIM460/doc/BSIM460Manual.pdf). The signs and values of piezoresistance coefficients, $\pi_x$, $\pi_y$, $\pi_z$, are different for electrons and holes; also they are known to be dependent on crystallographic orientation of silicon surface and, hence, on the transistor channel orientation.

To determine the coefficients in Eqs. (1) and (2) and some of additional model parameters the stress model calibration may be performed. The details of the calibration procedure can be found in Sukharev, et al. "3D IC TSV based technology: stress assessment for chip performance" AIP conference proceedings 1300: (2010) p. 202 and Sukharev, et al. "Multi-scale Simulation Methodology for Stress Assessment in 3D IC: Effect of Die Stacking on Device Performance" J. Electron Test, vol. 28 (2012), p. 63, which are incorporated herein by reference and are referred to hereinafter as the stress assessment papers.

Figure 3:
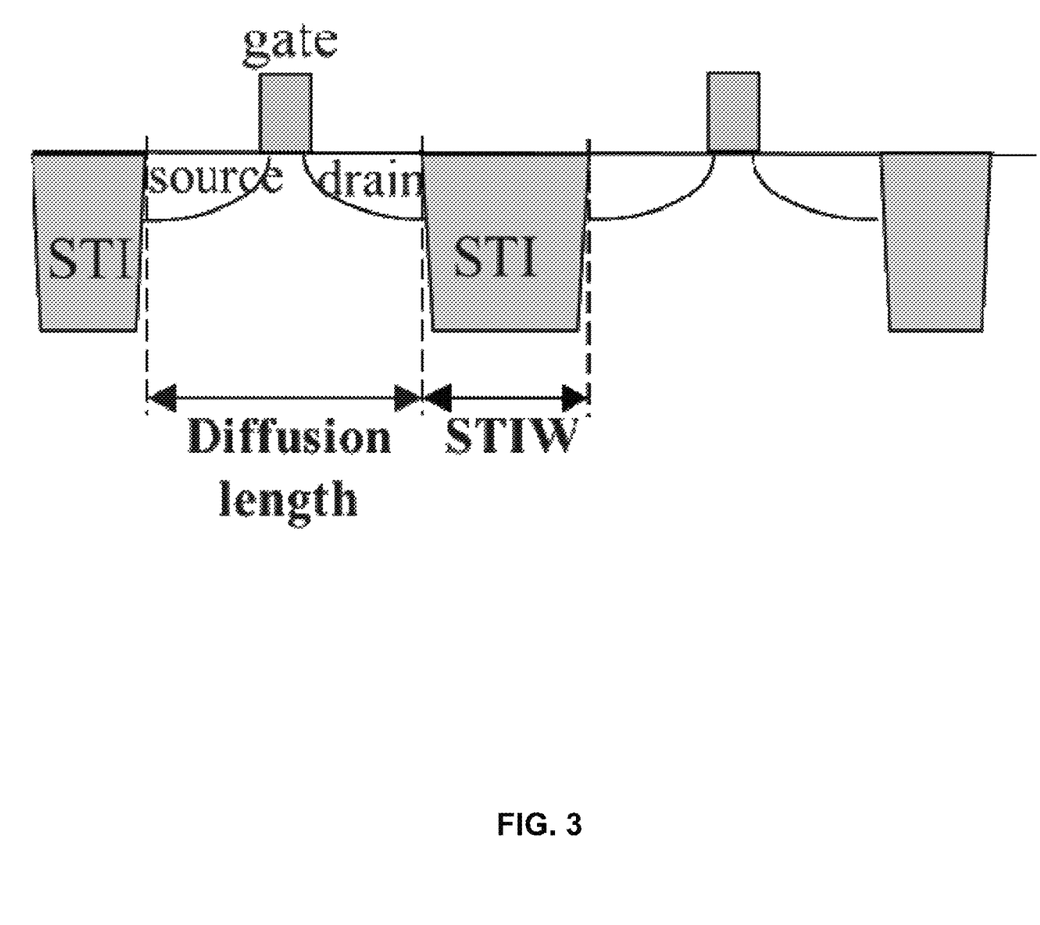
FIG. 3 illustrates the shallow trench isolation width (STIW).

Modification of STI-induced stress can influence the transistor threshold voltage. Due to process induced variations, described by the second term in Eq. (1), this stress source can have notable impact on the threshold voltage, while the impact on mobility may be weaker due to larger contribution of intentional stress sources. The stress from STI is dependent on the length of active area, as well as on the distance between adjacent actives which is commonly called STI width, or STIW, as illustrated in FIG. 3.

Leakage Reduction Tool

Figure 4:
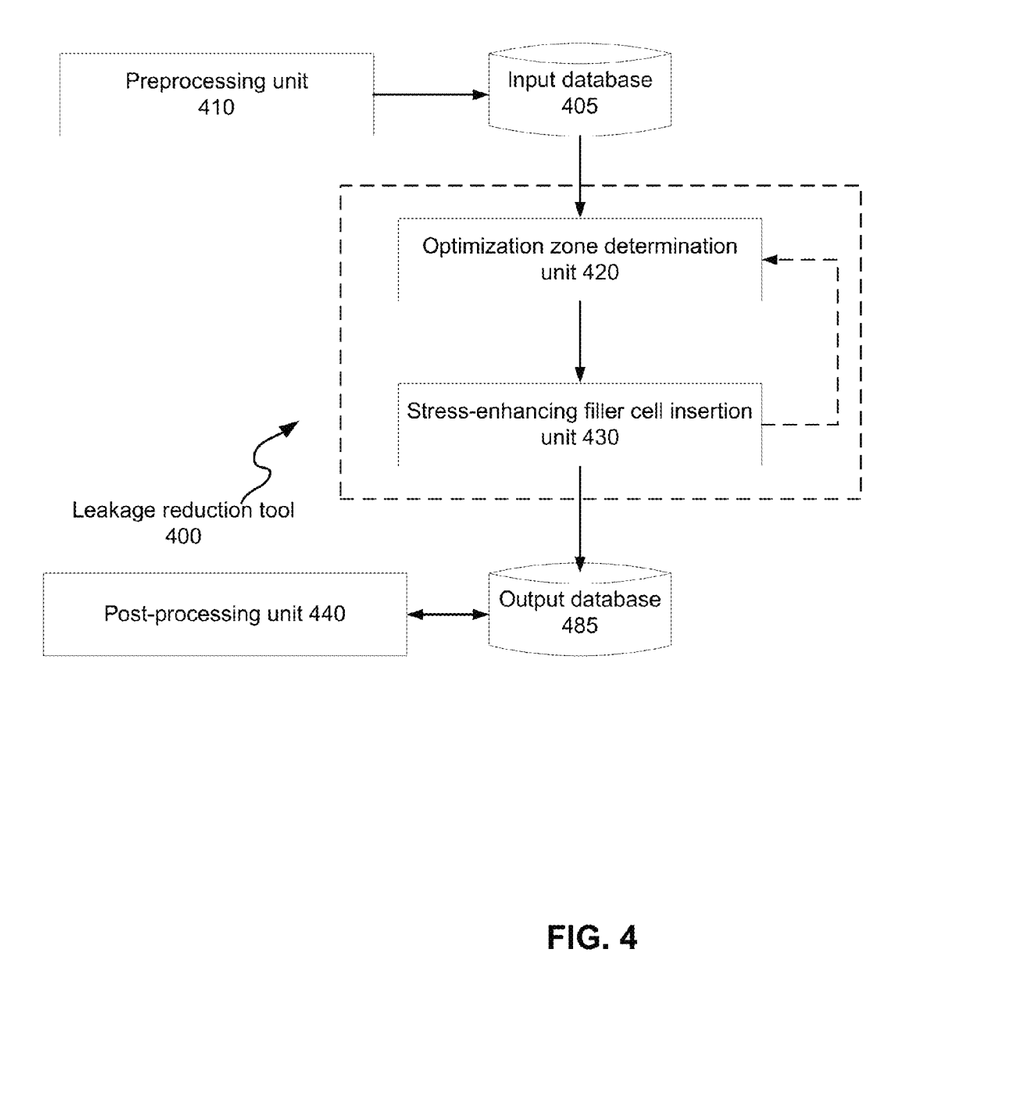
FIG. 4 illustrates an example of a leakage reduction tool that may be implemented according to various embodiments of the disclosed technology.

FIG. 4 illustrates an example of a leakage reduction tool 400 that may be implemented according to various embodiments of the disclosed technology. As seen in this figure, the leakage reduction tool 400 includes an optimization zone determination unit 420 and a stress-enhancing filler cell insertion unit 430. Some implementations of the leakage reduction tool 400 may cooperate with (or incorporate) one or more of a preprocessing unit 410, a post-processing unit 440, an input database 405 and an output database 485.

As will be discussed in more detail below, the optimization zone determination unit 420 determines an optimization zone in a row of cells on a layout design. The optimization zone is a portion of the row of cells between two consecutive fixed cells and comprises unfixed cells and one or more filler cells. The optimization zone may comprise one or more unfixed cells having devices with large leakage current. The devices with large leakage current may be identified by the preprocessing unit 410. The stress-enhancing filler cell insertion unit 430 inserts stress-enhancing filler cells into the optimization zone to replace some or all of the one or more filler cells and adjusts positions of the unfixed cells based on a leakage reduction analysis. The post-processing unit 440 may perform routing and timing closure on the layout design.

As previously noted, various examples of the disclosed technology may be implemented by one or more computing systems, such as the computing system illustrated in FIGS. 1 and 2. Accordingly, one or more of the optimization zone determination unit 420, the stress-enhancing filler cell insertion unit 430, the preprocessing unit 410, and the post-processing unit 440 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the optimization zone determination unit 420, the stress-enhancing filler cell insertion unit 430, the preprocessing unit 410, and the post-processing unit 440. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the optimization zone determination unit 420, the stress-enhancing filler cell insertion unit 430, the preprocessing unit 410, and the post-processing unit 440 are shown as separate units in FIG. 4, a single computer (or a single processor within a master computer) or a single computer system may be used to implement all of these units at different times, or components of these units at different times.

With various examples of the disclosed technology, the input database 405 and the output database 485 may be implemented using any suitable computer readable storage device. That is, either of the input database 405 and the output database 485 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 405 and the output database 485 are shown as separate units in FIG. 4, a single data storage medium may be used to implement some or all of these databases.

Leakage Reduction Process

Figure 5:
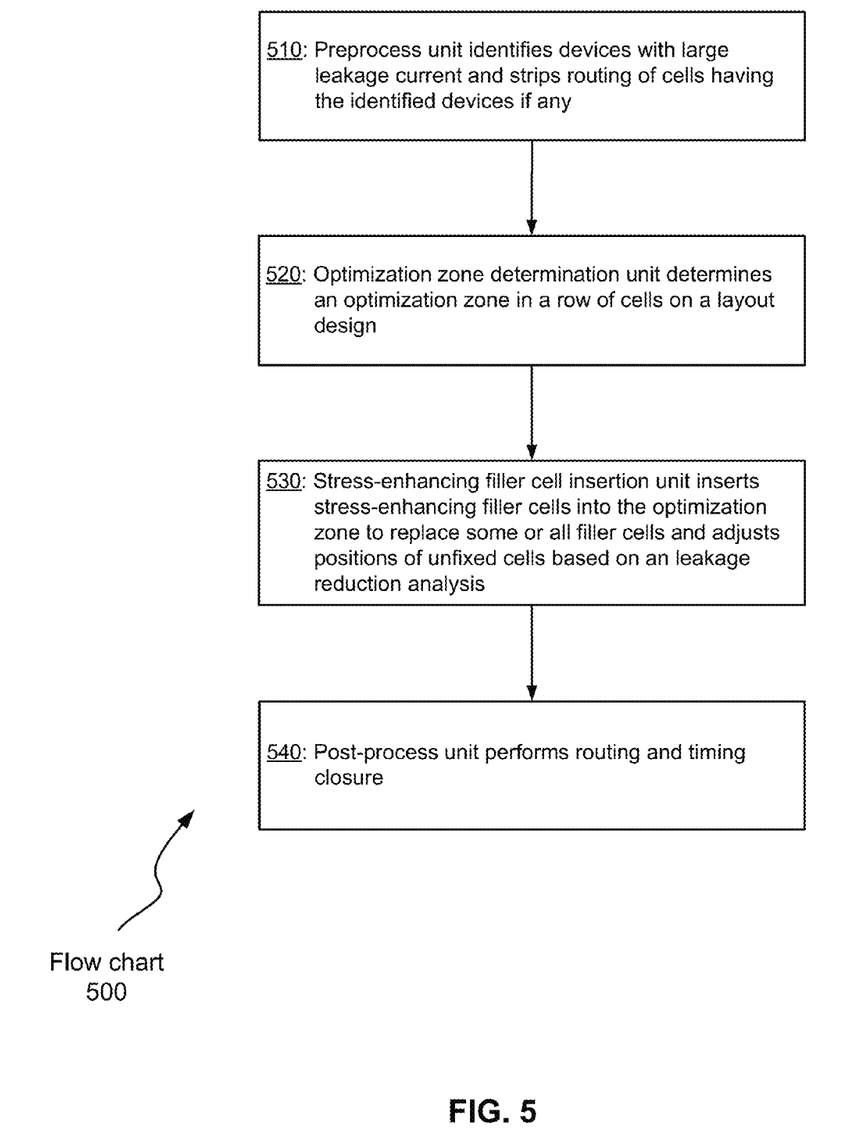
FIG. 5 illustrates an example of a flow chart describing a process of post-placement leakage reduction that may be employed according to various embodiments of the disclosed technology.

FIG. 5 illustrates a flowchart 500 showing a process of post-placement leakage reduction that may be implemented according to various examples of the disclosed technology. For ease of understanding, methods of post-placement leakage reduction that may be employed according to various embodiments of the disclosed technology will be described with reference to the leakage reduction tool 400 in FIG. 4 and the flow chart 500 illustrated in FIG. 5. It should be appreciated, however, that alternate implementations of a leakage reduction tool 400 may be used to perform the methods of post-placement leakage reduction illustrated by the flow chart 500 according to various embodiments of the disclosed technology. Likewise, the leakage reduction tool 400 may be employed to perform other methods of post-placement leakage reduction according to various embodiments of the disclosed technology. For example, one such method may be a process that does not include the operation 510 of the flowchart 500 or the operation 510 is replaced with a different operation.

In operation 510, the preprocessing unit 410 identifies devices with large leakage current. To perform the operation, the preprocessing unit 410 may employ the stress assessment tool in the Calibre family of software tools available from Mentor Graphics Corporation, Wilsonville, Oreg. For a given foundry process, the stress assessment tool analyzes layout-induced stress, identifies stress sources and calculates $\Delta V_t$ caused by stress for devices. Cells containing devices with large decreases in $V_t$ are considered leakage hotspots. More detailed information about the method used by the stress assessment tool may be found in the stress assessment papers.

In some embodiments of the disclosed technology, the identified devices are in the cells that are not only placed but also routed to completion and further timing-closed to achieve the targeted performance. To prepare the layout design for the subsequent reduction of leakage power using stress-enhancing filler cells, the preprocessing unit 410 strips off the routing.

In cell-based designs, filler cells are used to fill spaces between regular library cells to avoid planarity problems. These filler cells can occupy up to 30% of the total chip area. Since filler cells do not have any functionality, they can be replaced for introduction of a desired amount of mechanical stress in neighboring transistor channels. With various implementations of the disclosed technology, the preprocessing unit 410 may remove the existing filler cells to provide space for stress-enhancing filler cells. Alternatively, this operation may be performed by the stress-enhancing filler cell insertion unit 430.

Figure 6:
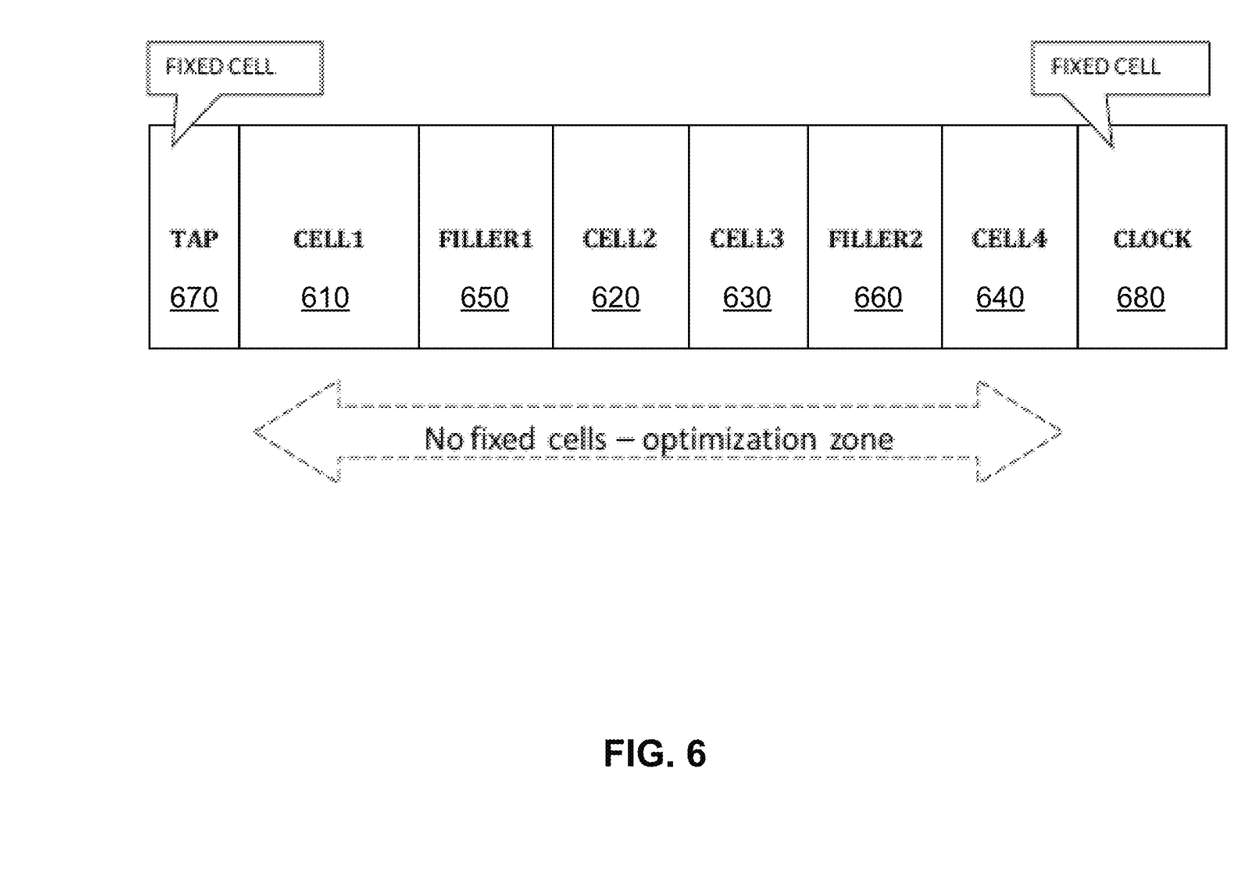
FIG. 6 illustrates an example of the optimization zone.

In operation 520, the optimization zone determination unit 420 determines an optimization zone in a row of cells on a layout design. After the placement of cells, locations of some cells such as clock cells and tap cells (having a well tap and a substrate tap for coupling a well region and a substrate region to a power source and ground, respectively) should not be changed. Only placement of other functional cells (i.e., unfixed cells) can be changed for stress reduction. With various implementations of the disclosed technology, the optimization zone, a portion of the row of cells between two consecutive fixed cells, is used to define the region where insertion of stress-enhancing filler cells and cell placement optimization may be performed. FIG. 6 illustrates an example of the optimization zone. In the figure, there are four unfixed cells 610-640 and two filler cells 650-660 between two fixed cells, a tap cell (670) and a clock cell (680). The optimization zone may contain one or more unfixed cells with large leakage current.

Figure 7:
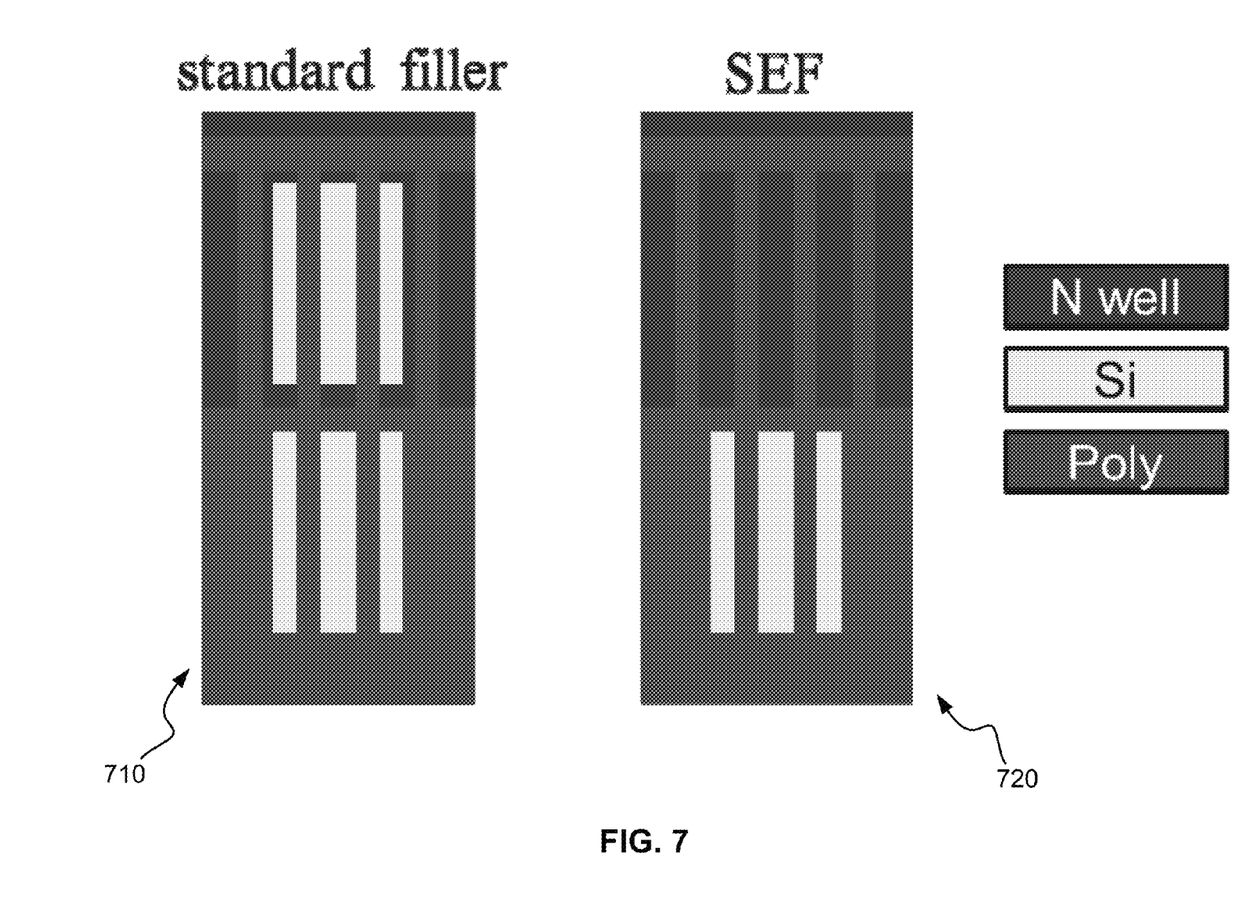
FIG. 7 illustrates an example of how to turn a standard filler cell to a stress-enhancing filler cell that may be implemented according to various examples of the disclosed technology.

In operation 530, the stress-enhancing filler cell insertion unit 430 inserts stress-enhancing filler cells into the optimization zone to replace some or all of the one or more filler cells and adjusts positions of the unfixed cells based on a leakage reduction analysis. Filler cell contains "dummy" transistor structures that can be modified in order to affect the stress in the neighborhood without impacting the design uniformity. FIG. 7 illustrates an example of how to turn a standard filler cell (710) to a stress-enhancing filler cell (720) that may be implemented according to various examples of the disclosed technology.

The stress-enhancing filler cell (720) is obtained by removing active area from the n-well region of the standard filler cell (710). This removal increases the amount of shallow trench isolation (STI) surrounding the pMOS devices located in the adjacent cells. As a result, additional compressive stress is generated, which increases $V_t$. The increase of $V_t$ has been shown to be the result of retarded dopant diffusion due to compressive stress. While this stress-enhancing filler cell also affects the carrier mobility, the effect is small or negligible due to the dominant contribution of epi-SiGe stresses. Though the removed diffusion region of the stress-enhancing filler cell serves as an epi-SiGe stressor, its effect on the neighbor transistors is not strong due to the small distance that the SiGe stress may propagate.

Figure 8:
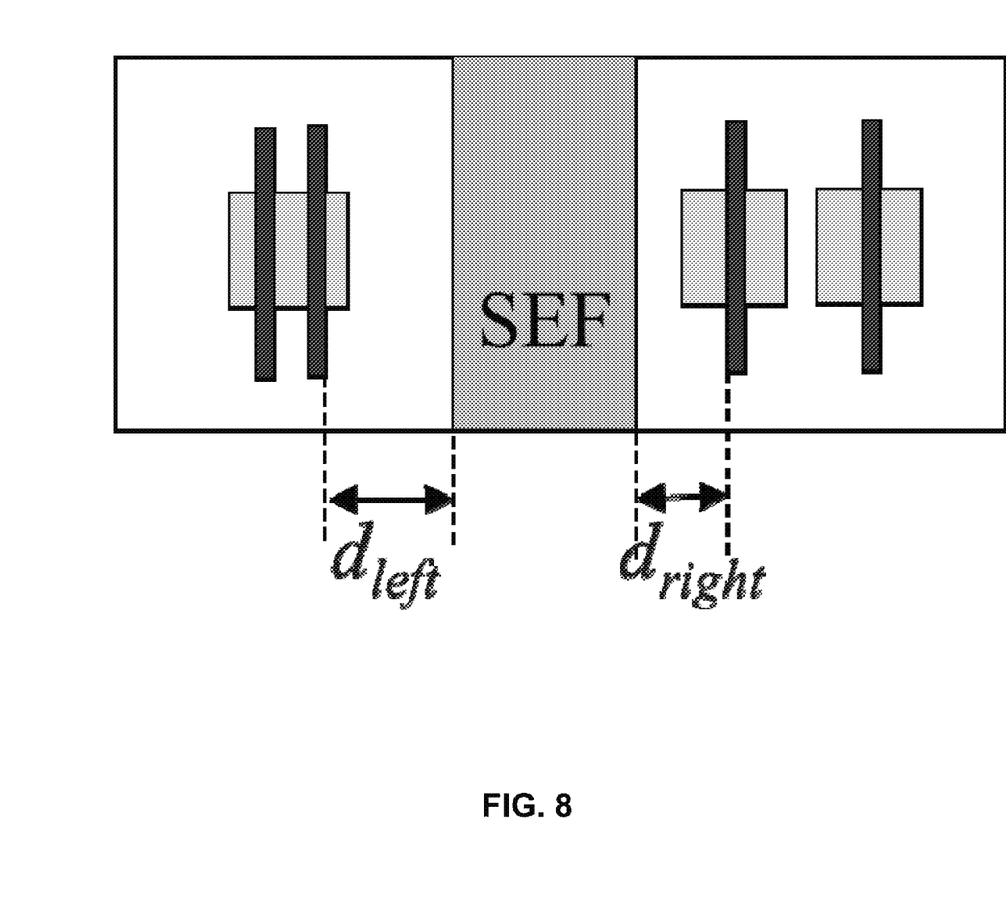
FIG. 8 illustrates the distance between the channel and SEF (stress-enhancing filler cell) edges.

The stress-enhancing filler cell-induced increase in $V_t$ of the pMOS devices depends on a distance between the channel and SEF (stress-enhancing filler cell) edges as shown in FIG. 8. Insertion of larger SEF cells (containing five and more poly lines) might result in larger $V_t$ changes in individual transistors; however, the net effect can be smaller, due to space limitation for the large SEF insertion. For nMOS devices, a different stress-enhancing filler cell is needed.

To insert stress-enhancing filler cells, the stress-enhancing filler cell insertion unit 430 removes some or all of the one or more filler cells in the optimization zone if it has not been done yet. The unfixed cells may be shifted to the right or left from their original positions within the optimization zone. The stress-enhancing filler cell insertion unit 430 may keep the order of cells unchanged to reduce possible negative impact on routability. The optimal placement of the unfixed cells and the inserted stress-enhancing filler cells may be the one which provides the largest reduction of $I_{sub}$.

With some implementations of the disclosed technology, the stress-enhancing filler cell insertion unit 430 may use a leakage reduction calculation as a cost function to guide the insertion of the stress-enhancing filler cells. The leakage reduction for an entire cell may be defined as a sum of $\Delta I_{sub}$:

$$\Delta I_{sub}(\text{cell}) = \Sigma \Delta I_{sub}(\text{device}_i), \text{device}_i \in \text{cell} \quad (3)$$

the stress-enhancing filler cells may be placed first next to an unfixed cell that can lead to the largest reduction in leakage current, then next to an unfixed cell that can lead to the second largest reduction in leakage current and so on.

In operation 540, the post-processing unit 440 performs routing and timing closure on the modified layout design. A commercial tool may be employed for this operation. The leakage current may be recalculated for the modified layout design.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. One or more non-transitory computer-readable media storing computer-executable instructions for causing one or more processors to perform a method, the method comprising:
   determining an optimization zone in a row of cells on a layout design, the optimization zone being a portion of the row of cells between two consecutive fixed cells, the optimization zone comprising unfixed cells and one or more filler cells, the fixed cells being functional cells of which positions cannot be changed, and the unfixed cells being functional cells of which positions can be changed; and
   inserting stress-increasing filler cells into the optimization zone to replace some or all of the one or more filler cells while cell placement of the optimization zone is adjusted based on a leakage reduction analysis;
   wherein the layout design describes an integrated circuit device or micro-electromechanical system (MEMS) device to be manufactured.

2. The one or more non-transitory computer-readable media recited in claim 1, wherein the optimization zone comprises one or more unfixed cells having devices with large leakage current.

3. The one or more non-transitory computer-readable media recited in claim 2, wherein the devices with large leakage current are identified based on analyzing layout-induced stress of devices of the layout design.

4. The one or more non-transitory computer-readable media recited in claim 2, wherein the devices with large leakage current are pMOS (p-type metal-oxide-semiconductor) devices.

5. The one or more non-transitory computer-readable media recited in claim 4, wherein the stress-increasing filler cells are obtained by removing active area from n-well regions of the filler cells.

6. The one or more non-transitory computer-readable media recited in claim 1, wherein devices of the layout design are placed and routed before the inserting, wherein the routing of the unfixed cells is removed and the inserting keeps the order of the unfixed cells, and wherein the method further comprises: performing rerouting.

7. The one or more non-transitory computer-readable media recited in claim 1, wherein the inserting comprises placing the stress-increasing filler cells first next to an unfixed cell that can lead to the largest reduction in leakage current, then next to an unfixed cell that can lead to the second largest reduction in leakage current and so on.

8. The one or more non-transitory computer-readable media recited in claim 1, wherein the method further comprises:

performing stress analysis to identify devices with large leakage current, one or more of the devices with large leakage current being in the optimization zone.

9. A method, executed by at least one processor of a computer, comprising:

determining an optimization zone in a row of cells on a layout design, the optimization zone being a portion of the row of cells between two consecutive fixed cells, the optimization zone comprising unfixed cells and one or more filler cells, the fixed cells being functional cells of which positions cannot be changed, and the unfixed cells being functional cells of which positions can be changed; and inserting stress-increasing filler cells into the optimization zone to replace some or all of the one or more filler cells while cell placement of the optimization zone is adjusted based on a leakage reduction analysis;

wherein the layout design describes an integrated circuit device or micro-electromechanical system (MEMS) device to be manufactured.

10. The method recited in claim 9, wherein the optimization zone comprises one or more unfixed cells having devices with large leakage current.

11. The method recited in claim 10, wherein the devices with large leakage current are identified based on analyzing lay-out-induced stress of devices of the layout design.

12. The method recited in claim 10, wherein the devices with large leakage current are pMOS (p-type metal-oxide-semiconductor) devices.

13. The method recited in claim 12, wherein the stress-increasing filler cells are obtained by removing active area from n-well regions of the filler cells.

14. The method recited in claim 9, wherein devices of the layout design are placed and routed before the inserting, wherein the routing of the unfixed cells is removed and the inserting keeps the order of the unfixed cells, and wherein the method further comprises: performing rerouting.

15. The method recited in claim 9, wherein the inserting comprises placing the stress-increasing filler cells first next to an unfixed cell that can lead to the largest reduction in leakage current, then next to an unfixed cell that can lead to the second largest reduction in leakage current and so on.

16. The method recited in claim 9, further comprising:

performing stress analysis to identify devices with large leakage current, one or more of the devices with large leakage current being in the optimization zone.

17. A system comprising:

one or more processors, the one or more processors programmed to perform a method, the method comprising:

determining an optimization zone in a row of cells on a layout design, the optimization zone being a portion of the row of cells between two consecutive fixed cells, the optimization zone comprising unfixed cells and one or more filler cells, the fixed cells being functional cells of which positions cannot be changed, and the unfixed cells being functional cells of which positions can be changed; and inserting stress-increasing filler cells into the optimization zone to replace some or all of the one or more filler cells while cell placement of the optimization zone is adjusted based on a leakage reduction analysis;

wherein the layout design describes an integrated circuit device or micro-electromechanical system (MEMS) device to be manufactured.

\* \* \* \* \*